United States Patent [19]
Fukui et al.

[11] Patent Number: 5,438,418
[45] Date of Patent: Aug. 1, 1995

[54] ROBOT-TEACHING CASSETTE

[75] Inventors: Shoji Fukui; Toshiyuki Watanabe; Masaki Suzuki, all of Osaka, Japan

[73] Assignee: Matsushita Electric Industrial Co., Ltd., Osaka, Japan

[21] Appl. No.: 49,496

[22] Filed: Apr. 21, 1993

Related U.S. Application Data

[63] Continuation-in-part of Ser. No. 7,777, Jan. 22, 1993, abandoned.

[30] Foreign Application Priority Data

Jan. 22, 1992 [JP] Japan .................................. 4-8909

[51] Int. Cl.⁶ .............................................. G01B 11/00
[52] U.S. Cl. ........................................................ 356/399
[58] Field of Search ................................. 356/399–401, 356/375, 373

[56] References Cited

U.S. PATENT DOCUMENTS 5,177,563 1/1993 Everett et al. ....................... 356/375

Primary Examiner—Richard A. Rosenberger
Assistant Examiner—K. P. Hantis
Attorney, Agent, or Firm—Wenderoth, Lind & Ponack

[57] ABSTRACT

A robot-teaching cassette is used to teach a robot to position a wafer cassette or a substrate cassette on a cassette-supporting base by the robot, without using the wafer cassette or the substrate cassette. The robot-teaching cassette includes a fixing section capable of being fixed in position on the cassette-supporting base, a moving section capable of being held with a robot-chucking section of the robot and moving separately from the fixing section, a light source provided on the fixing section or the moving section, and a target establishing a reference position, for receiving beams emitted by the light source and provided on the fixing section or the moving section.

4 Claims, 8 Drawing Sheets

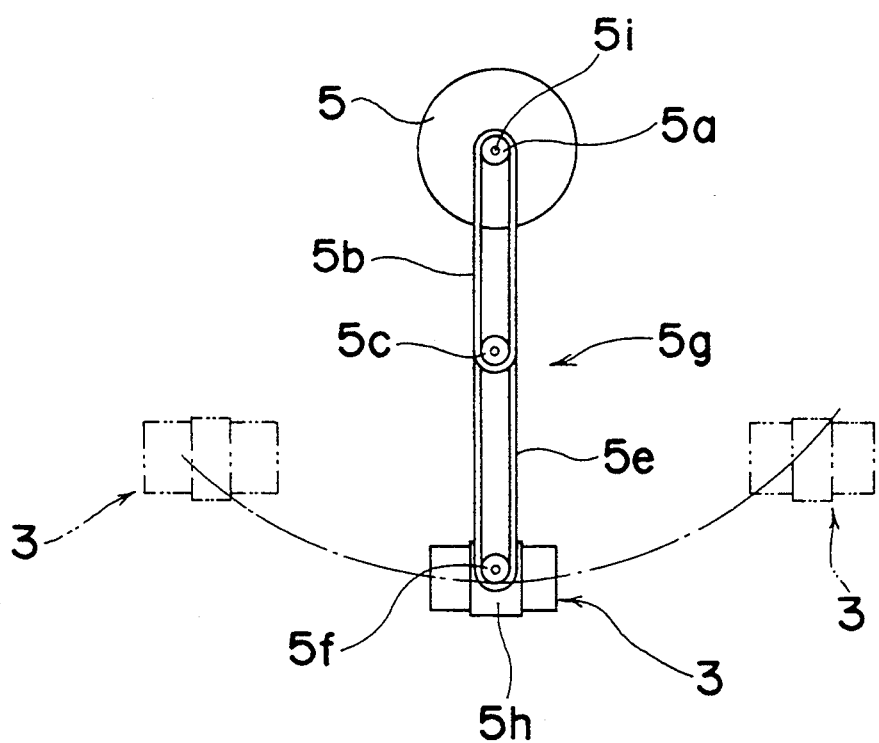

ROBOT-TEACHING CASSETTE

This is a Continuation-In-Part of U.S. Ser. No. 08/007,777 filed Jan. 22, 1993, now abandoned.

BACKGROUND OF THE INVENTION

The present invention relates to a robot-teaching cassette by which a robot will be taught to mount a wafer cassette or a substrate cassette on an apparatus for manufacturing a semiconductor or a liquid crystal display device. More specifically, the present invention relates to a robot-teaching cassette which is used to teach a robot to position a cassette on a cassette-supporting base without using the wafer cassette or the substrate cassette.

An example of a conventional robot-teaching method by which a robot will automatically mount a wafer cassette or a substrate cassette on an apparatus for manufacturing a semiconductor or a liquid crystal display device will be described below with reference to FIGS. 8A, 8B and 8C.

The apparatus comprises a cassette-supporting base 1; two cassette-receiving members 2; and a robot 5 including a robot-chucking section 3. Each cassette-receiving member 2 is fixed to the cassette-supporting base 1. The robot-chucking section 3 can be opened and closed by moving its arms 3d horizontally and is fixed to a main body of the robot 5. That is, the robot 5 has a robot arm 5g connected with the chucking section 3 as shown in FIG. 8B and is movable horizontally by a motor of the robot 5. Two cylinders 3e which have piston rods 3f for moving the arms 3d of the chucking section 3 are fixed to an end plate 5h of the robot arm 5g. The piston rods 3f of the cylinders 3e are moved in opposite outward directions to increase the distance between the edges 3b of the arms 3d of the chucking section 3 so that the cassette 4 can be inserted between the edges 3b of the arms 3d. After the insertion of the cassette 4, the piston rods 3f of the cylinders 3 are moved in opposite inward directions to decrease the distance between the edges 3b of the arms 3d until the arms 3d hold the cassette 4 between the edges 3b. The robot arm 5g has four pulleys 5a, 5c, 5d and 5f, a belt 5b extending around the pulleys 5a and 5c, and a belt 5e extending around the pulleys 5d and 5f. The pulley 5d rotates in accordance with the rotation of the pulley 5c. According to the above structure, when an arm shaft 5i connected with a motor shaft of the motor for the robot 5 is rotated by the motor, the belt 5b and the pulley 5c engaged with the belt 5b rotate in accordance with the rotation of the pulley 5a. Then, the pulley 5d rotates together with the pulley 5c to rotate the belt 5e and the pulley 5f. As a result, the chucking section 3 rotates in accordance with the rotation of the robot arm 5g around the arm shaft 5i. That is, even though the robot arm 5g is revolved around the arm shaft 5i by the motor, the pulleys 5a, 5c, 5d, and 5f are rotated to drive the belts 5b and 5e so that the orientation of the arms 3d is not changed, as shown in FIG. 8C.

The method for teaching the robot to mount a cassette 4 on the cassette-supporting base is described below.

The cassette 4 is chucked on the robot-chucking section 3 which is then operated in X, Z, and Y (perpendicular to the sheet of FIG. 8A) directions, and θ direction (rotational direction about Z-axis) to place the cassette 4 on the cassette-supporting base 1 as positioned by the cassette-receiving member 2. The positioning of the robot 5 is accomplished by an operator's sense of touch and rough visual observation. The position data thus determined is electronically stored by a control device (not shown in FIGS. 8A and 8B) of the robot 5.

There is a possibility that carrying out the above-described method may damage the cassette 4, the robot-chucking section 3, the cassette-supporting base 1, or the cassette-receiving member 2 because the robot-chucking section 3, the cassette-supporting base 1, and the cassette-receiving member 2 become interlocked with each other via the cassette 4. In addition, because the robot-teaching operation is performed based on the operator's sense of touch and rough visual observation, it is difficult to teach the robot 5, the robot 5 taught in this manner is often not at an accurate position, and the positions of the robot 5 vary according to the operator who taught the robot. Furthermore, the robot-teaching operation takes a long time.

SUMMARY OF THE INVENTION

It is an object of the present invention to provide a robot-teaching cassette which will not damage a robot-chucking section, a cassette-supporting base, a cassette-receiving member, and itself when a robot is mounting the cassette on an apparatus for manufacturing a semiconductor or a liquid crystal display device, by doing away with the need to use the wafer cassette or substrate cassette in the robot teaching operation.

It is another object of the present invention to provide a robot-teaching cassette for facilitating the accurate positioning of a robot in a short period of time regardless of whether any particular operator performs the positioning of the robot (robot-teaching operation).

In accomplishing these and other objects of the present invention, there is provided a robot-teaching cassette which is used to teach a robot to mount a wafer cassette or a substrate cassette on a cassette-supporting base, comprising:
- a fixing section capable of being fixed to the cassette-supporting base;
- a moving section capable of being held with a robot-chucking section of the robot and moving separately from the fixing section;
- a light source provided on the fixing section or the moving section; and
- a target establishing a reference position, for receiving beams emitted by the light source, provided on the fixing section or the moving section.

According to the above structure, the moving section is capable of moving separately from the fixing section, and the use of light allows the moving section to remain out of contact with the fixing section in carrying out the positioning of the robot. Therefore, the apparatus, the robot, and the cassette will not be damaged. In addition, the robot can be placed at an accurate position in a short period of time independently of the judgement of an operator.

BRIEF DESCRIPTION OF THE DRAWINGS

These and other objects and features of the present invention will become clear from the following description taken in conjunction with the preferred embodiments thereof with reference to the accompanying drawings, in which:

FIG. 8C is a plan view of the robot.

DETAILED DESCRIPTION OF THE INVENTION

Figure 1:
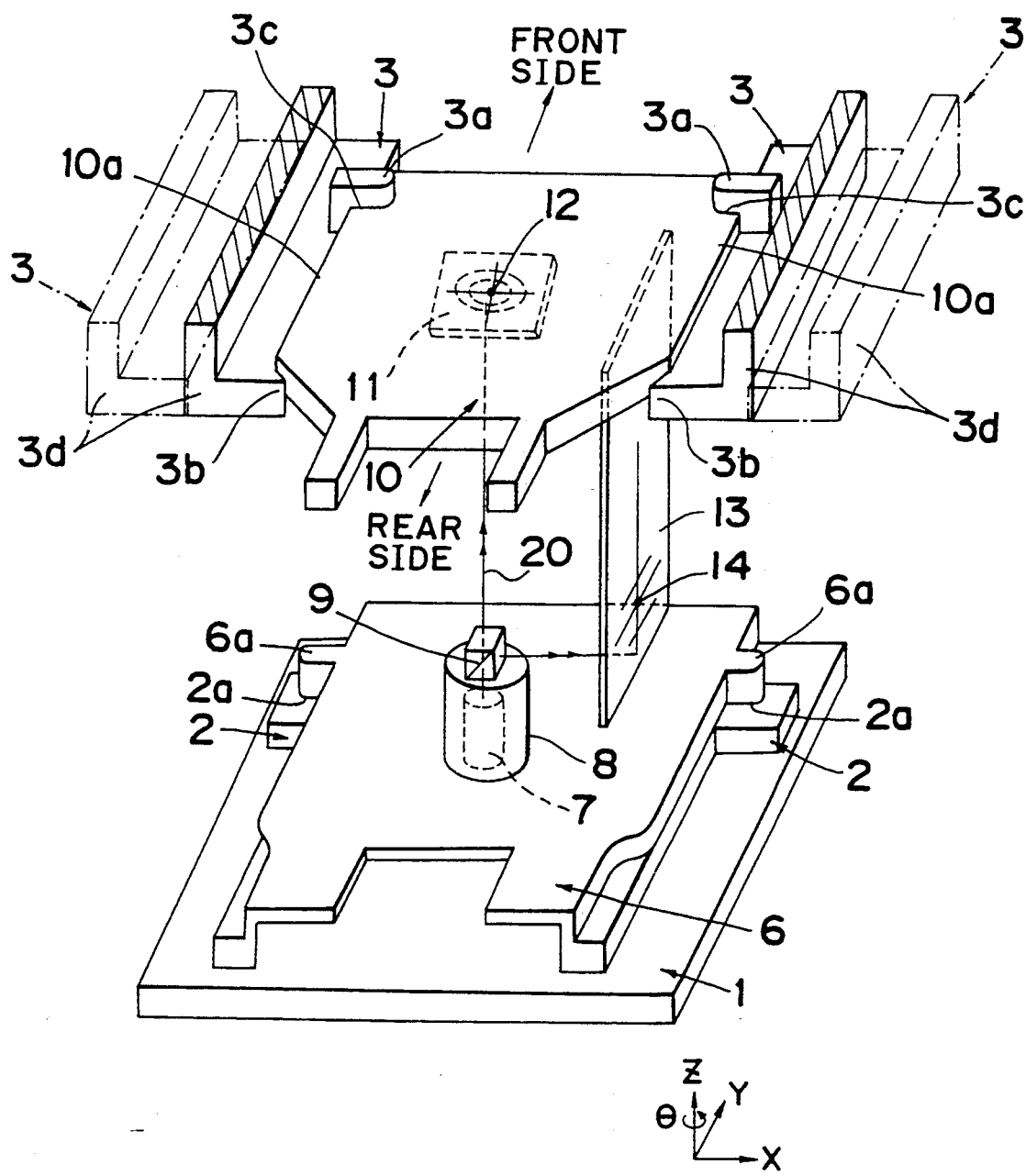
FIG. 1 is a perspective view of a first embodiment of a robot-teaching cassette according to the present invention.

Before the description of the present invention proceeds, it is to be noted that like parts are designated by like reference numerals throughout the accompanying drawings.

A first embodiment of a robot-teaching cassette according to the present invention will be described below with reference to FIG. 1.

Figure 2:
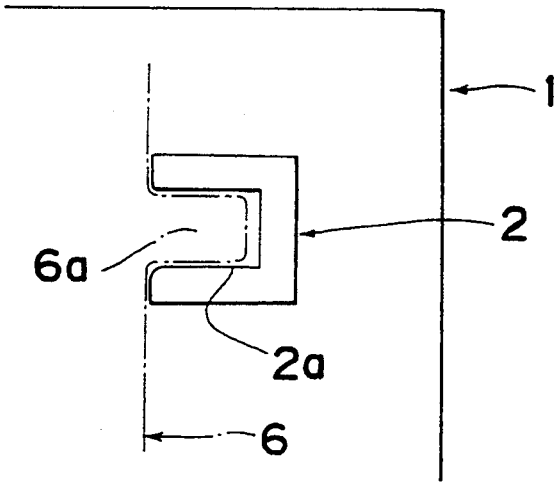
FIG. 2 is an enlarged plan view of a projection of a fixing section of the cassette and a cassette-receiving member fixed to cassette-supporting base.
Figure 3:
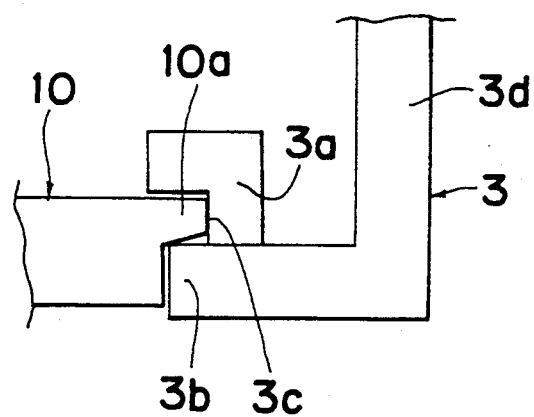
FIG. 3 is a rear view of an edge of a moving section of the cassette and a projection of an arm of a chuck section.
Figure 4:
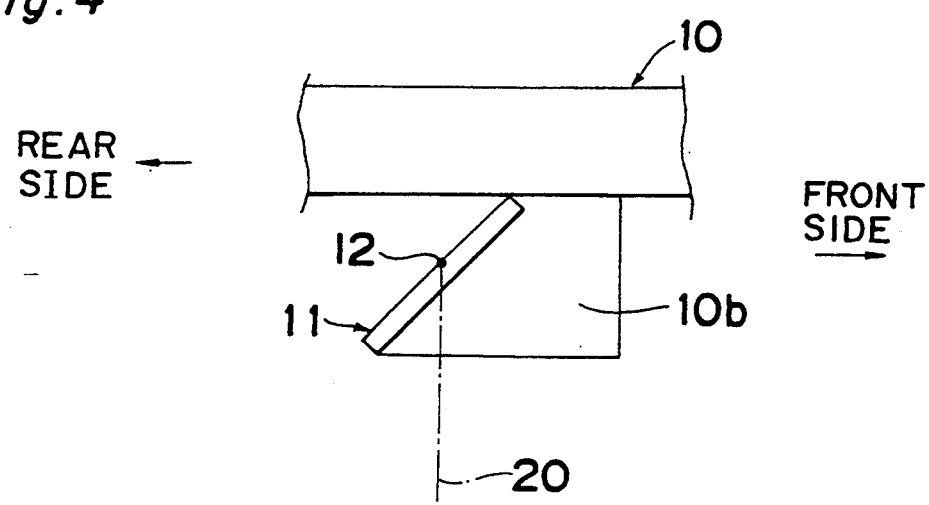
FIG. 4 is an enlarged side view of a first target of the cassette fixed to the moving section.
Figure 8A:
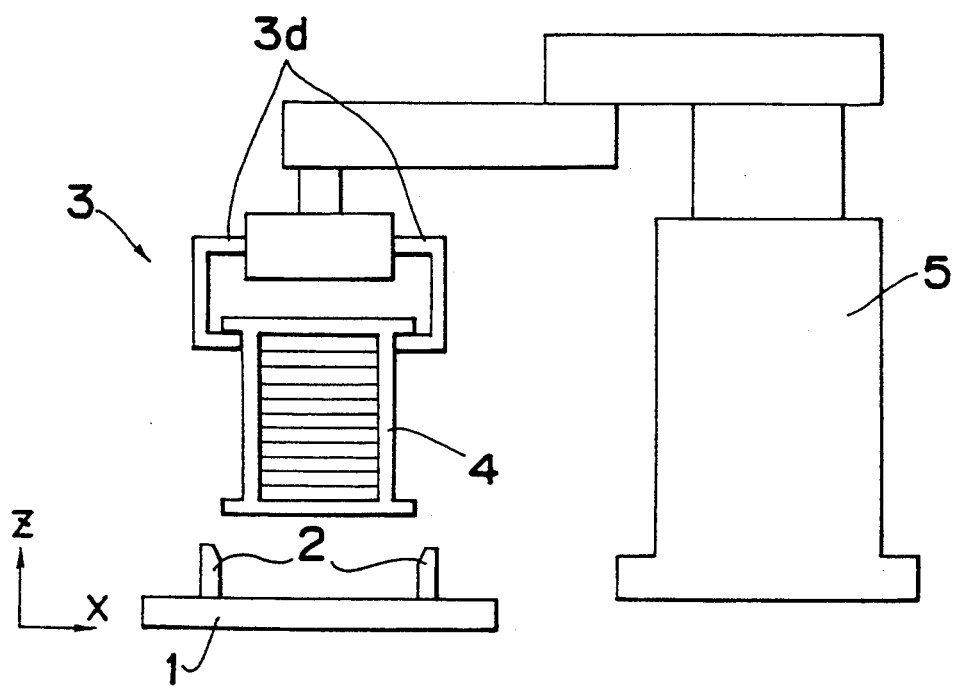
FIG. 8A is a rear view of a system using a conventional robot-teaching cassette in carrying out a robot-teaching operation.
Figure 8B:
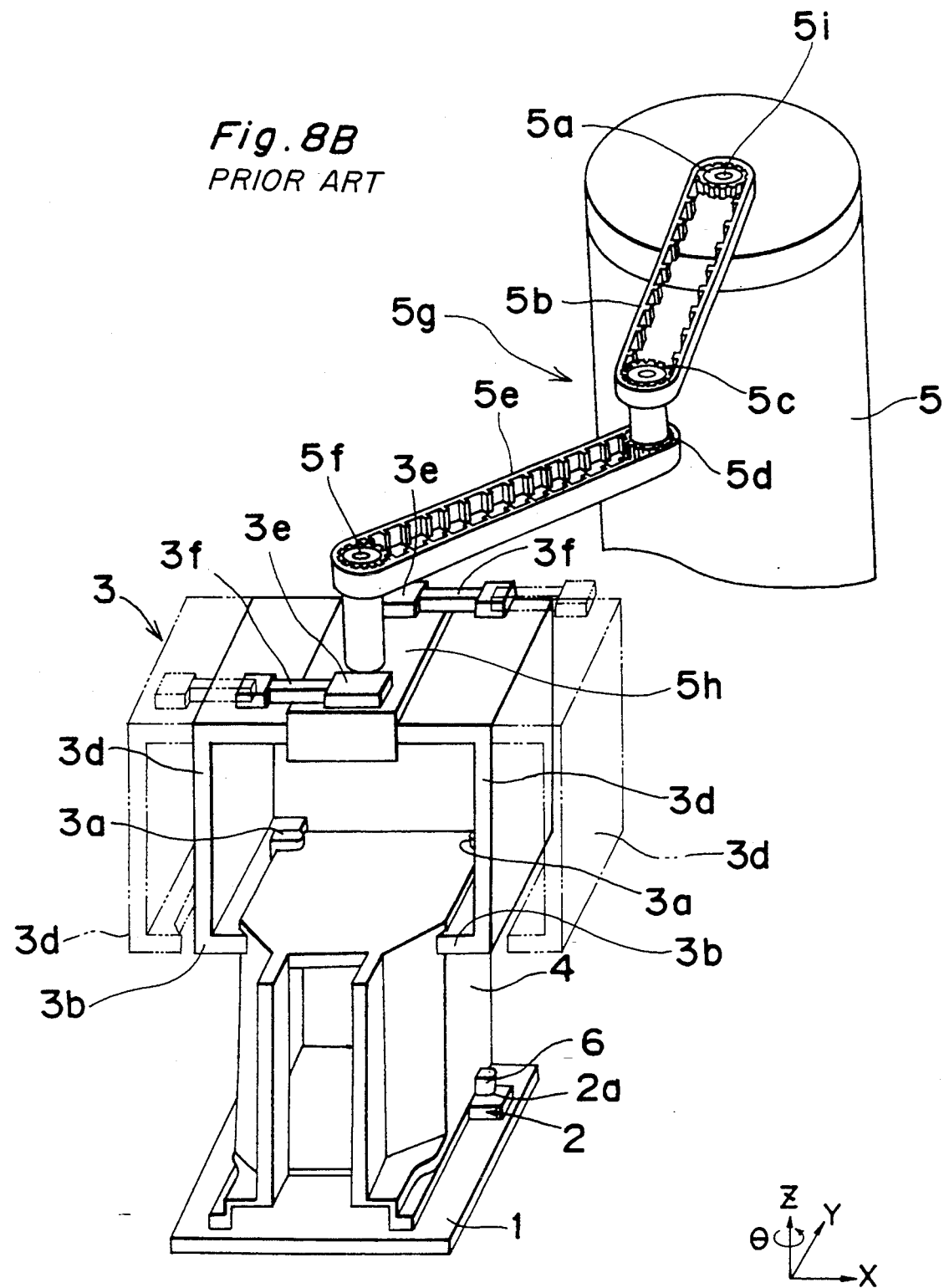
FIG. 8B is a perspective view of the system shown in FIG. A.

As shown in FIG. 1, an apparatus for manufacturing a semiconductor or a liquid crystal display device, comprises: a cassette-supporting base 1; cassette-receiving members 2; and a robot 5 having a robot-chucking section 3. The robot-teaching cassette is used to teach the robot 5 shown in FIG. 8A to mount the cassette 4 on the cassette-supporting base 1. The robot-teaching cassette comprises a fixing section 6, a moving section 10, a semiconductor laser 7 serving as a light source, a beam splitter 9, and first and second targets 11 and 13 serving to establish reference positions. The cassette-receiving members 2 are fixed to the cassette-supporting base 1. As shown in FIG. FIG. 2, each of the cassette-receiving members 2 has a recess 2a for receiving a projection 6a of the fixing section 6 so as to fixedly and removably hold the fixing section 6 of the cassette. The robot-chucking section 3 can be opened and closed by moving arms 3d thereof horizontally and is fixed to the main body of a robot (e.g. 5 in FIG. 8B). The fixing section 6 is placed on the cassette-supporting base 1, the movement of which in X- and Y-directions is prohibited by the cassette-receiving members 2. The semiconductor laser 7 is fixed to the fixing section 6. The beam splitter 9 is fixed to a semiconductor laser-protecting cover 8 and splits laser beams emitted by the semiconductor laser 7 into vertical and horizontal beams. The moving section 10 can be held by the robot-chucking section 3 and is capable of moving separately from the fixing section 6. As shown in FIG. 3, each side edge 10a of the moving section 10 is inserted into a recess 3c, defined by an L-shaped projection 3a and the edge 3b of each arm 3d of the chuck section 3, by moving the arm 3d of the chuck section horizontally towards the side edge 10a. Thus, the chuck section 3 can hold the moving section 10. On the other hand, when the arms 3d move away from the edges 10a of the moving section 10, the moving section 10 is removed from the chuck section 3. The first target 11 comprises a transparent acrylic plate painted white on one surface thereof, and is fixed to the moving section 10 at an angle of 45° thereto through a bracket 10b shown in FIG. 4, and is used for teaching X and Y coordinates of positions to the robot. A first reference point 12 is formed on the first target 11. The second target 13 comprises a transparent acrylic plate painted white on one surface thereof, is fixed to the moving section 10 at an angle of 90° thereto and is used for teaching Z and $\theta$ coordinates of positions to the robot. A second reference point 14 is formed on the second target 13.

The operation of the cassette having the above-described structure and the robot-teaching method using the cassette are described below.

Figure 5:
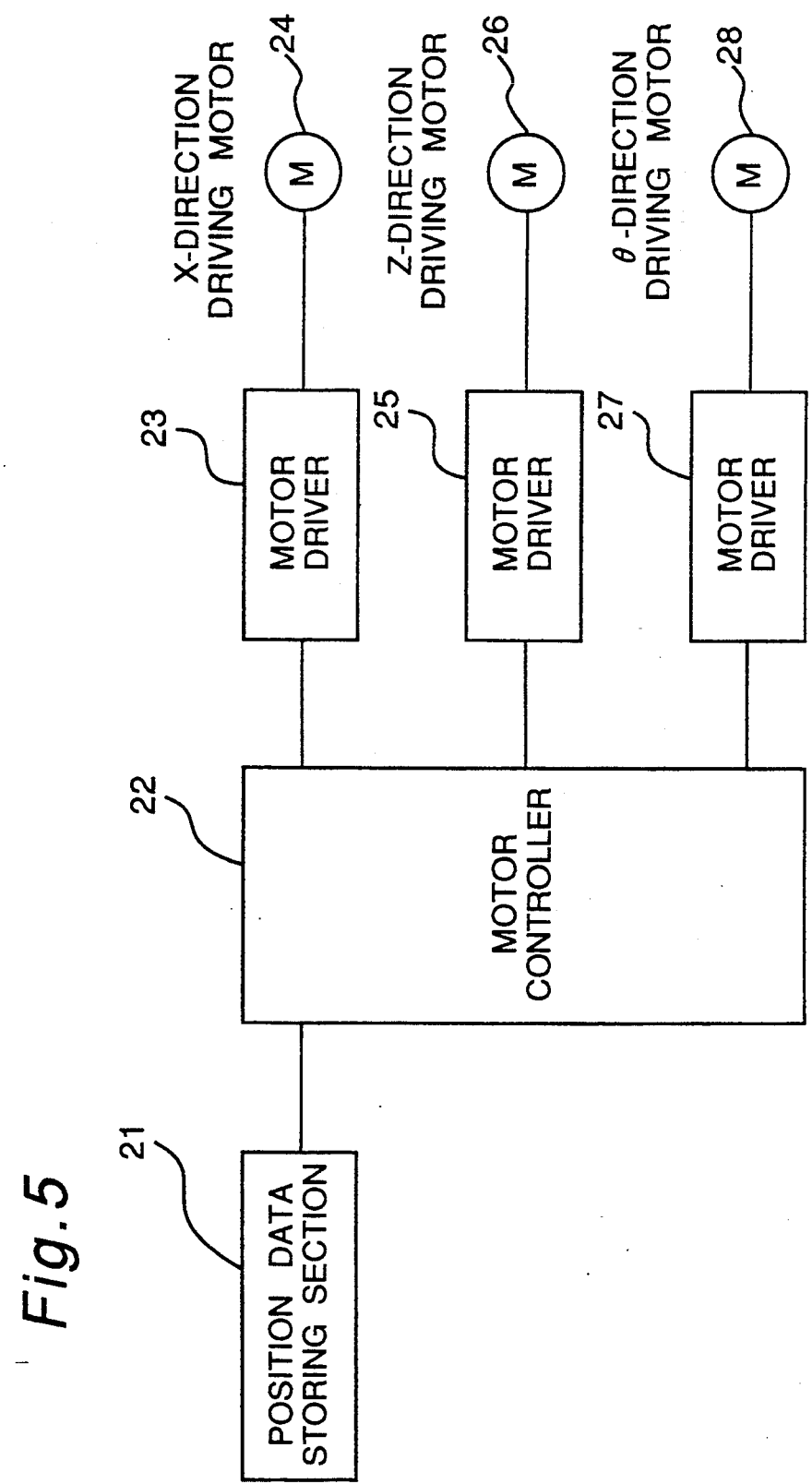
FIG. 5 is a block diagram of a control device of the robot.

Laser beams 20 emitted by the semiconductor laser 7 are split into vertical and horizontal beams by the beam splitter 9 and incide on the white surface of the first target 11 and that of the second target 13 to form optical points thereon, respectively. The positions of the first target 11 and the second target 13 have been previously adjusted so that each of the optical points will coincide with the first reference point 12 and the second reference point 14, respectively, when the robot is in the correct position. The robot-chucking section 3 which has chucked the moving section 10 is moved in the X and Y directions and the Z and $\theta$ directions. The position data thus obtained is electronically stored in a control device of the robot (shown in FIG. 5). The control device includes a position data storing section 21, a motor controller 22, motor drivers 23, 25, 27, an X-direction driving motor 24, a Z-direction driving motor 26, and a $\theta$-direction driving motor 28. As the robot-chucking section 3, which has chucked the moving section 10, is moved in the X and Y directions and the Z and $\theta$ directions until the robot 5 is brought to the correct position, i.e. during the positioning of the moving section 10, the position data is stored in the storing section 21 so that this data can be used to control the robot in mounting a wafer cassette or a substrate cassette to the cassette-supporting base 1.

Figure 6:
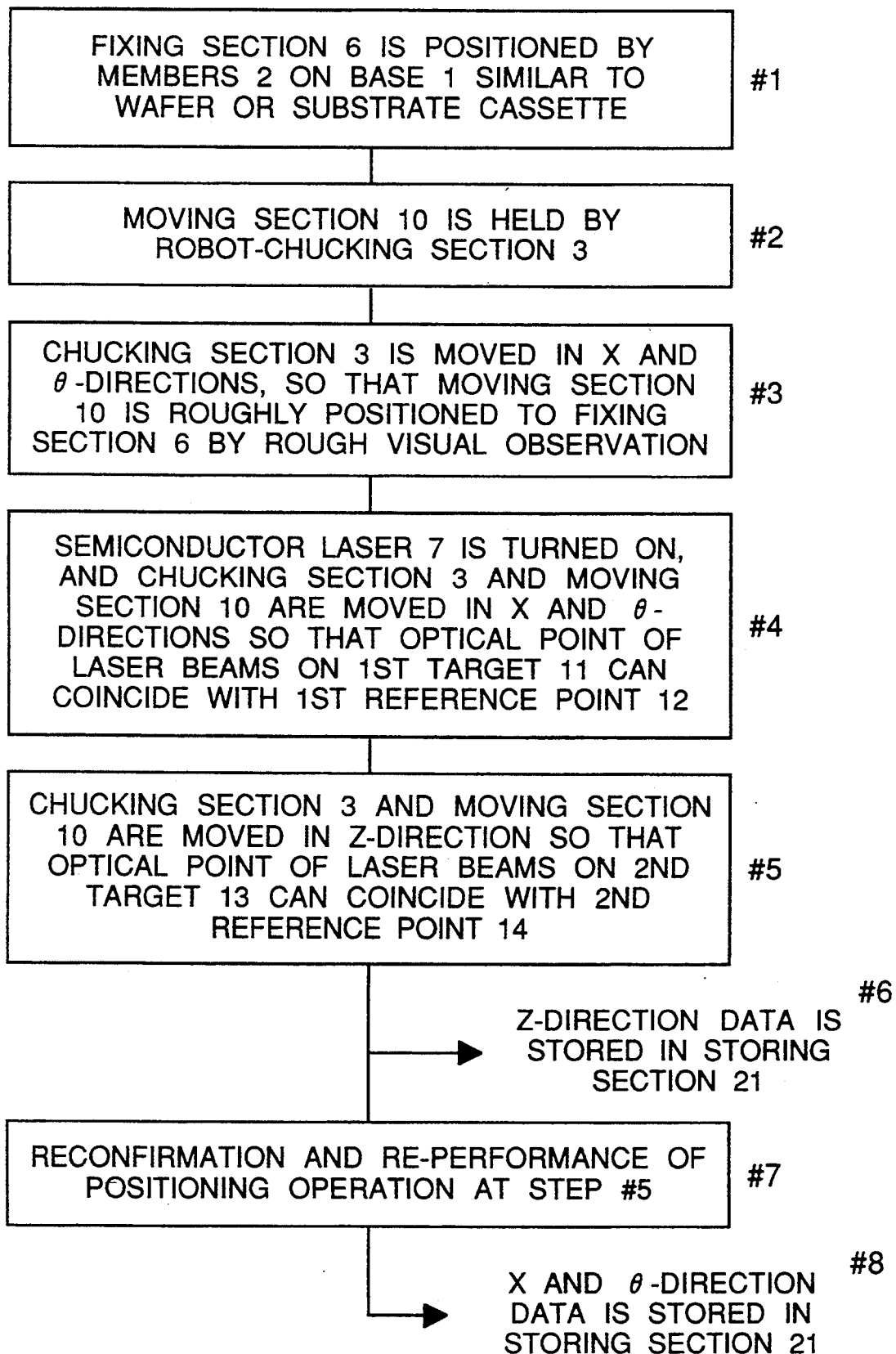
FIG. 6 is a flow chart of a robot-teaching method carried out using the cassette of the present invention.

FIG. 6 is a flow chart of the robot-teaching method. At step #1, the fixing section 6 of the robot-teaching cassette is positioned by the cassette-receiving member 2 on the cassette-supporting base 1 similar to the manner in which a wafer cassette or a substrate cassette is to be positioned by the cassette-receiving members 2. At step #2, the moving section 10 of the robot-teaching cassette is held by the arms 3d of the robot-chucking section 3. At step #3, the robot-chucking section 3 holding the moving section 10 is moved in the X-direction and the $\theta$-direction of the robot 5, so that the moving section 10 is roughly positioned above the fixing section 6 by rough visual observation. At step #4, the power source of the semiconductor laser 7 is turned on, and the robot-chucking section 3 together with the moving section 10 is moved in the X-direction and the $\theta$-direction until the optical point formed by the laser beam on the first target 11 coincides with the first reference point 12. At step #5, the robot-chucking section 3 together with the moving section 10 is moved in the Z-direction of the robot 5 until the optical point formed by the laser beam on the second target 13 coincides with the second reference point 14. At step #6, the Z-direction data is stored in the storing section 21. At step #7, it is reconfirmed that the optical point of the laser beam on the first target 11 coincides with the first reference point 12. If not, the robot-chucking section 3 together with the moving section 10 is moved in the X-direction and the θ-direction so that the optical point of the laser beam on the first target 11 coincides with the first reference point 12. At step #8, the X-direction data and θ-direction data is stored in the storing section 21.

Then, when a wafer cassette or a substrate cassette is positioned on the cassette-supporting base 1, the above X, Z, and θ-direction data stored in the data storing section 21 is utilized.

As described above, according to the first embodiment, the moving section 10 does not contact the fixing section 6. Therefore, the apparatus, its robot, and the cassette will not be damaged. Because the operator visually checks whether the optical point formed on each target coincides with the reference point of each target, the robot-teaching operation can be accomplished easily in a short period of time and the positioning of the robot can be achieved with a high accuracy independently of the judgement of an individual operator.

Although a semiconductor laser has been described in connection with the first embodiment, other visible beams may be used with the spot diameters thereof being reduced by a lens. In the first embodiment, one surface of each of the first and second targets 11 and 13 is painted white, but both surfaces thereof may be transparent. Further, the semiconductor laser 7 serving as a light source may be provided on the moving section 10 and the target 11 may be provided on the fixing section 6.

A robot-teaching cassette according to a second embodiment of the present invention will be described below with reference to FIG. 7.

Figure 7:
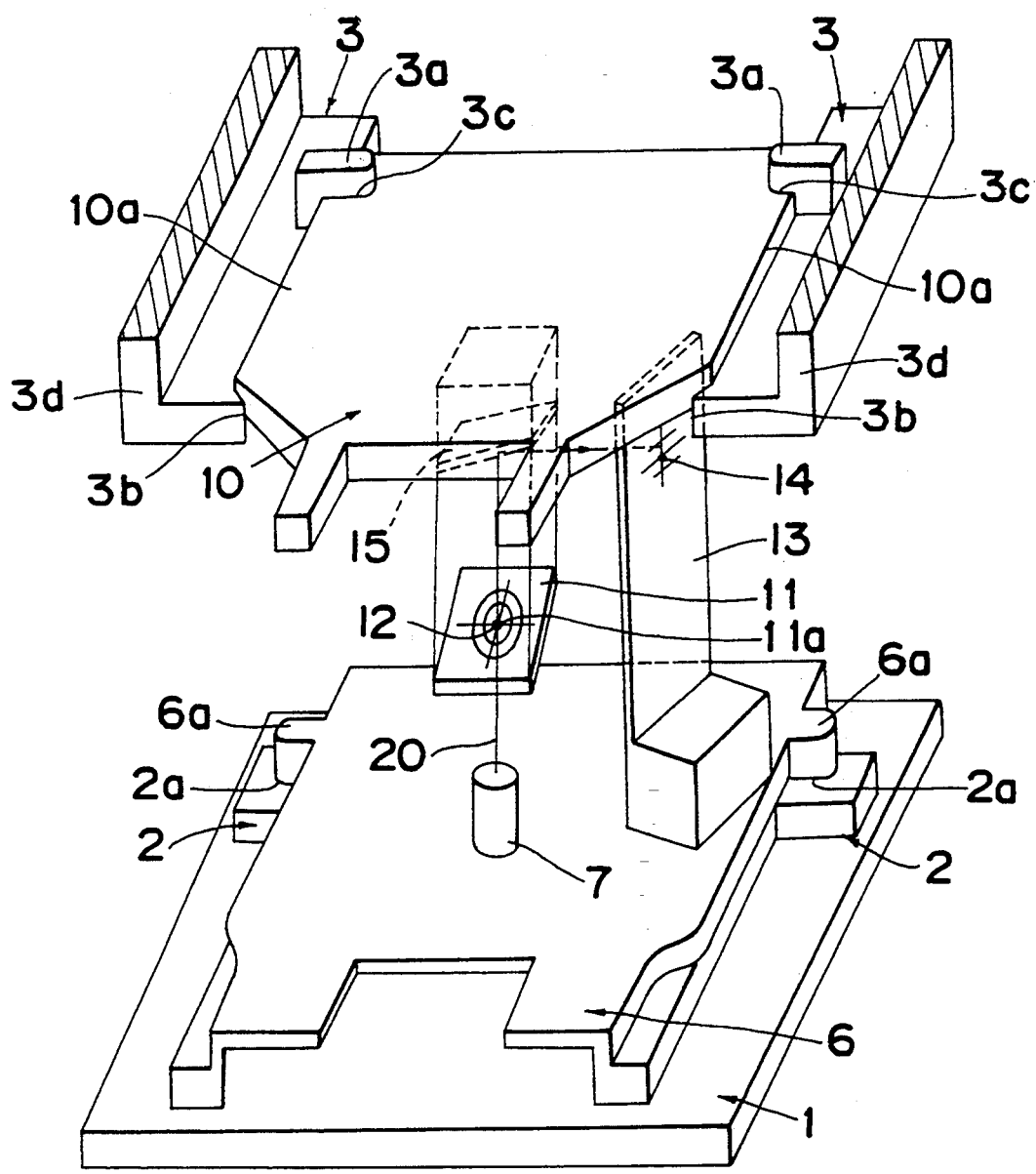
FIG. 7 is a perspective view of a second embodiment of a robot-teaching cassette according to the present invention.

As shown in FIG. 7, the robot-teaching cassette comprises a mirror 15 instead of the beam splitter 9. The first target 11 has an opening 11a of approximately as small as 0.6 mm to transmit laser beams therethrough, and is used for teaching the X and Y coordinates of positions to the robot. The first reference point 12 coincides with the center of the opening 11a formed in the first target 11. The second target 13 is fixed to the fixing section 6 at an angle of 90° thereto and is used for teaching the Z and θ coordinates of positions to the robot. The mirror 15 is fixed to the lower surface of the moving section 10 at an angle of 45° thereto and horizontally reflects laser beams, which have been incident thereon, at such an angle of 45°.

The operation of the cassette having the above structure and the robot-teaching method using the cassette are described below.

Laser beams emitted by the semiconductor laser 7 pass through the opening 11a of the first target 11 and are then reflected horizontally by the mirror 15, thus being incident on the white surface of the second target 13 to form an optical point thereon. The position of the first target 11 and that of the second target 13 have been previously adjusted so that the laser beam will pass through the first reference point 12 and the optical point will coincide with the second reference point 14 when the robot is in the correct position. The robot-chucking section 3 which has chucked the moving section 10 is moved in the X and Y directions until the laser beams pass through the first reference point 12 and then, the robot-chucking section 3 is moved in the Z and θ directions until the optical point coincides with the second reference point 14. In this manner, the robot is moved to the correct position and the position data thus obtained is electronically stored by the control device shown in FIG. 5.

As described above, according to the second embodiment, the moving section 10 does not contact the fixing section 6. Therefore, the apparatus, its robot, and the cassette will not be damaged. Because an operator visually checks whether the optical point formed on the second target coincides with the reference point of the second target, the robot-teaching operation can be accomplished easily in a short period of time and the positioning of the robot can be carried out with high accuracy independently of the judgement of an individual operator. Furthermore, the mirror 15 for changing the direction of laser beams can be manufactured at a low cost as compared with a beam splitter.

Although a semiconductor laser has been described in connection with the second embodiment, other visible beams may be used with the spot diameter thereof being reduced by a lens. In the second embodiment, one surface of the second target 13 is painted white, but both surfaces thereof may be transparent. Further, the semiconductor laser 7 serving as a light source and the second target 13 may be provided on the moving section 10 and the first target 11 and the mirror 15 may be provided on the fixing section 6.

Although the present invention has been fully described in connection with the preferred embodiments thereof with reference to the accompanying drawings, it is to be noted that various changes and modifications will become apparent to those skilled in the art. Such changes and modifications are to be understood as included within the scope of the present invention as defined by the appended claims unless they otherwise depart therefrom.

What is claimed is:

1. A robot-teaching cassette used for teaching a robot to mount a wafer cassette or a substrate cassette on a cassette-supporting base, said robot-teaching cassette comprising:
   a fixing section capable of being detachably secured to the cassette-supporting base;
   a moving section capable of being held by a robot-chucking section of the robot and being movable relative to said fixing section;
   a light source provided on one of the fixing section and the moving section; said light source including a beam source and a beam splitter which splits a beam emitted by the source into a beam extending perpendicular to and a beam extending parallel to the section of the robot-teaching cassette provided with the beam source;
   a first target, establishing a reference position, provided on one of the fixing section and the moving section, and
   a second target, establishing a second reference position, provided on said other of the fixing section and the moving section.

2. A robot-teaching cassette used for teaching a robot to mount a wafer cassette or a substrate cassette on a cassette-supporting base, said robot-teaching cassette comprising:
   a fixing section capable of being detachably secured to the cassette-supporting base;
   a moving section capable of being held by a robot-chucking section of the robot and being movable relative to said fixing section;
   a light source provided on one of the fixing section and the moving section;

a first target having a small region defining a reference position and provided on the other of the fixing and the moving section, and said first target being capable of transmitting a beam emitted from the light source only from said small region thereof defining the reference position;

a second target incapable of transmitting the beam emitted from said light source, said second target defining another reference position; and means for changing the direction of a beam transmitted from said small region of said first target, said means being disposed on said other of the fixing section and the moving section of the robot-teaching cassette.

3. A combination of a cassette-supporting base of a manufacturing apparatus, a robot used to mount a wafer cassette or a substrate cassette on said cassette-supporting base turning a manufacturing operation, and a robot-teaching cassette used for teaching the robot to mount the wafer cassette or the substrate cassette on the cassette-supporting base, wherein said cassette-supporting base includes a cassette-receiver, the robot includes a chucking section, and means for moving the chucking section in an X-direction and a Y-direction orthogonal to said X-direction and for rotating the chucking section about an axis orthogonal to both said X- and Y-directions, and said robot-teaching cassette comprises a fixing section engageable with said cassette-receiver so as to be fixed in position on said cassette-supporting base, a moving section capable of being held by the chucking-section of said robot and being movable by the chucking section of said robot relative to said fixing section when said fixing section is fitted in position on said cassette-supporting base, a light source provided on one of the fixing section and the moving section, the light source including a beam source and a beam splitter which splits a beam emitted by the source into a horizontally propagating beam and a vertically propagating beam when said fixing section is fixed in position on said cassette-supporting base and said moving section is held by the chucking section of said robot, a first target, establishing a reference position, provided on the other Of said fixing section and said moving section and a second target, establishing a second reference position, provided on said other of the fixing section and the moving section.

4. A combination of cassette-supporting base of a manufacturing apparatus, a robot used to mount a wafer cassette or a substrate cassette on said cassette-supporting base during a manufacturing operation, and a robot-teaching cassette used for teaching the robot to mount the wafer cassette or the substrate cassette on the cassette-supporting base, wherein said cassette-supporting base includes a cassette receiver, the robot includes a chucking section, and means for moving the chucking section in an X-direction and a y-direction orthogonal to said X-direction and for rotating the chucking section about an axis orthogonal to both said X- and Y-directions, and said robot-teaching cassette comprises a fixing section engageable with said cassette-receiver so as to be fixed in position on said cassette-supporting base, a moving section capable of being held by the chucking section of said robot and being movable by the chucking section of said robot relative to said fixing section when said fixing section is fitted in position on said cassette-supporting base, a light source provided one of the fixing section and the moving section, a first target having a small region defining reference position and provided on the other of said fixing section and said moving section, said first target being capable of transmitting a beam emitted by the light source only from said small region thereof defining the reference position, a second target being incapable of transmitting a beam emitted from said light source, said second target defining another reference position, and means for changing the direction of the beam transmitted from said small region of said first target, said means being disposed on said other of said fixing section and said moving section of the robot-teaching cassette.

* * * * *